(12) United States Patent
Downey et al.

(10) Patent No.: US 7,026,229 B2
(45) Date of Patent: Apr. 11, 2006

(54) ATHERMAL ANNEALING WITH RAPID THERMAL ANNEALING SYSTEM AND METHOD

(75) Inventors: Daniel F. Downey, Gloucester, MA (US); Edwin A. Arevalo, Waltham, MA (US)

(73) Assignee: Vartan Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/996,446

(22) Filed: Nov. 28, 2001

(65) Prior Publication Data

US 2003/0157813 A1    Aug. 21, 2003

(51) Int. Cl.
H01L 21/425 (2006.01)
H01L 21/265 (2006.01)

(52) U.S. Cl. ...................... 438/530; 438/522
(58) Field of Classification Search ............ 438/796, 438/798–799, 522, 528, 530
See application file for complete search history.

(56) References Cited

U.S. PATENT DOCUMENTS

| | | | |
|---|---|---|---|
| 3,887,993 A * | 6/1975 | Okada et al. ............... 438/220 |
| 4,303,455 A * | 12/1981 | Splinter et al. ............. 438/799 |
| 4,490,183 A | 12/1984 | Scovell |
| 4,522,657 A * | 6/1985 | Rohatgi et al. ............. 438/528 |
| 4,743,569 A * | 5/1988 | Plumton et al. ............ 438/522 |
| 5,011,794 A * | 4/1991 | Grim et al. ................. 438/796 |
| 5,523,262 A * | 6/1996 | Fair et al. ................... 438/799 |
| 6,037,235 A * | 3/2000 | Narwankar et al. ........ 438/396 |
| 6,044,203 A * | 3/2000 | Dawson et al. ............ 392/416 |
| 6,051,483 A | 4/2000 | Lee et al. |
| 6,066,547 A * | 5/2000 | Maekawa ................... 438/486 |
| 6,166,354 A * | 12/2000 | Hause et al. ............... 324/751 |
| 6,225,197 B1 * | 5/2001 | Maekawa ................... 438/149 |
| 6,316,123 B1 * | 11/2001 | Lee et al. ................... 428/641 |
| 6,555,453 B1 * | 4/2003 | Xiang et al. ............... 438/581 |
| 6,767,808 B1 * | 7/2004 | Ryoo ......................... 438/510 |

FOREIGN PATENT DOCUMENTS

| | | |
|---|---|---|
| EP | 1 130 659 A1 | 5/2001 |
| JP | 2001144095 A * | 5/2001 |
| WO | WO 01/71787 A1 | 9/2001 |

OTHER PUBLICATIONS

Mullet et al, Device Electronics for Integrated Circuits, 1986, John Wiley & Sons, Second Edition, pp. 79-82.*
Thompson, K., Electromagnetic Induction Heating for Cold Wall Rapid Thermal Processing, 9th International Conference on Advanced Thermal Processing of Semiconductors—RTP 2001, No. 7419519, Sep. 25-29, 2001, pp. 190-196, XP002248749, USA, Anchorage.

(Continued)

*Primary Examiner*—Jermele Hollington

(57) ABSTRACT

A method and system to achieve shallow junctions using Electromagnetic Induction Heating (EMIH) that can be preceded or followed by a low-temperature Rapid Thermal Annealing (RTA) process. The methods and systems can use, for example, RF or microwave frequencies to induce electromagnetic fields that can induce currents to flow within the silicon wafer, thus causing ohmic collisions between electrons and the lattice structure that heat the wafer volumetrically rather than through the surface. Such EMIH heating can activate the dopant material. Defects in the silicon structure can be repaired by combining the EMIH annealing with a low-temperature (approximately 500–800 degrees Celsius) RTA that causes minimal diffusion, thus minimizing the difference between the as-implanted junction depth and the post-annealing junction depth when compared to annealing methods that only use traditional RTA.

11 Claims, 7 Drawing Sheets

OTHER PUBLICATIONS

Fukano, T., Microwave Annealing for Low Temperature VLSI Processing, International Electron Devices Meeting, Washington, Dec. 1-4, 1985, Washington, IEEE, US, Dec. 1985, pp. 224-227, XP000842652.

* cited by examiner

TM011                           TM111
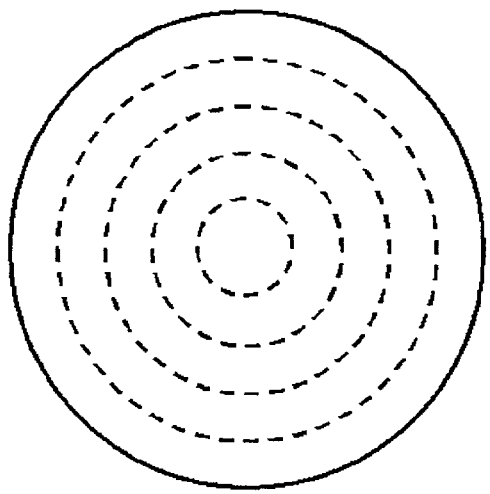
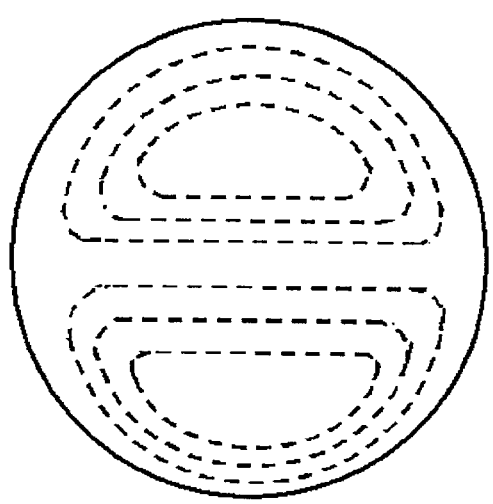
FIG. 2A                          FIG. 2B

ATHERMAL ANNEALING WITH RAPID THERMAL ANNEALING SYSTEM AND METHOD

BACKGROUND (1) Field

The disclosed methods and systems relate generally to annealing processes, and more particularly to athermal annealing.

(2) Description of Relevant Art

Conventional ion implantation systems include ionizing a dopant material such as boron, accelerating the ions to form an ion beam having a given energy level, and directing the ion beam energy at a semiconductor surface or wafer to introduce the dopant material to the semiconductor and alter the conductivity properties of the semiconductor. Once the ions are embedded into the crystalline lattice of the semiconductor, the ions can be activated using a process known as rapid thermal annealing (RTA) or rapid thermal process (RTP). During RTA, the semiconductor can be introduced to a furnace to heat the semiconductor at a prescribed temperature and for a prescribed time. RTA can also cure defects in the crystalline structure that can be caused by the ion implantation.

The processes of ion implantation and RTP contribute to the depth of the implanted region, known as the junction depth. Those of ordinary skill in the art recognize that the junction depth from ion implantation is based on the energy of the ions implanted into the semiconductor. Accordingly, shallow implanted regions can be formed using low-energy ion beams. Unfortunately, traditional methods of RTA include raising the temperature of the silicon to ranges nearing 1100–1200 degrees Celsius, which can approach the melting temperature of the silicon. Accordingly, RTA can further increase the implanted junction depth as high temperatures of the RTA process cause further diffusion of the implanted region.

The increase in junction depth can be particularly troublesome when considered with respect to a continuing and expanding demand for smaller devices, and hence shallower junction depths. It is anticipated that the present methods and systems that combine ion implantation solely with traditional RTA may not satisfy the demand for shallower junctions.

SUMMARY

The disclosed methods and systems include features for annealing a semiconductor structure that include subjecting the semiconductor structure to an oscillating magnetic field and applying a low temperature rapid thermal annealing (LTRTA) process to the semiconductor structure. The electromagnetic field can be a time-varying electromagnetic field that can be provided by, for example, a signal having a frequency in the microwave or the radio frequency (RF) bands.

In one embodiment, the LTRTA can include exposing the semiconductor to a temperature less than approximately 800 degrees Celsius, while in another embodiment, the temperature can be greater than approximately 500 degrees Celsius, and less than approximately 800 degrees Celsius. The RTA can be performed in a furnace or another annealing device.

For the disclosed methods and systems, the LTRTA can be performed either before or after the application of electromagnetic field or energy.

The methods and systems can accordingly be implemented with and/or applied to ion implantation systems where dopant material ions can be implanted into a semiconductor structure or wafer. The semiconductor wafer can include silicon or Gallium Arsenide, for example. The dopant can be any one of an n-type dopant and a p-type dopant.

Other objects and advantages will become apparent hereinafter in view of the specification and drawings.

BRIEF DESCRIPTION OF THE DRAWINGS

FIG. 2A is a TM011 magnetic field pattern;

FIG. 2B is a TM111 magnetic field pattern;

DESCRIPTION

Figure 1:
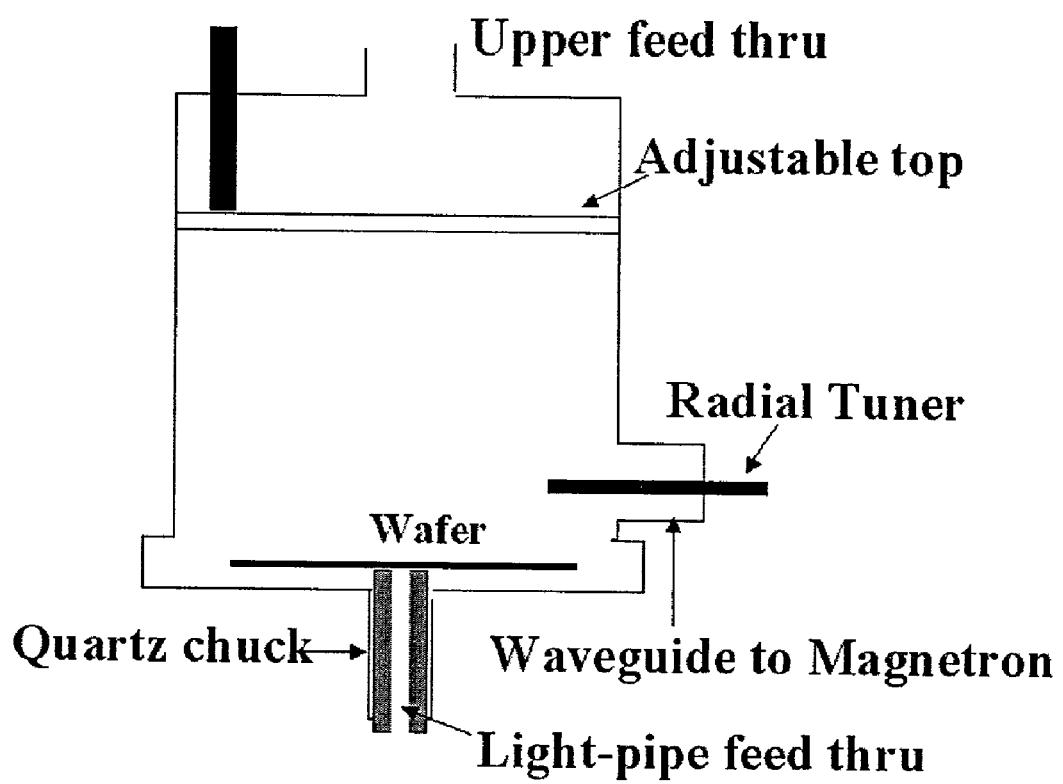
FIG. 1 is one embodiment of a system and method for performing Electromagnetic Induction Heating (EMIH) annealing using microwave frequencies.

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore features, components, modules, and/or aspects of the illustrations can be otherwise combined, separated, interchanged, and/or rearranged without departing from the disclosed systems or methods.

During ion implantation, the implanted regions can be damaged when the accelerated, energized dopant ions collide with the host or silicon surface, displacing silicon atoms from their original lattice sites. Although the dopant ions can be in high-energy non-equilibrium positions in the silicon lattice, the dopant ions are not electrically active. A rapid thermal annealing (RTA) process can provide energy to the silicon and dopant ions to allow movement of the ions to equilibrium positions, thereby also repairing the implantation damage by restoring crystallographic order. Unfortunately, the RTA process that exposes the semiconductor surface to high temperatures in the range of 1000–1200 degrees Celsius, often also causes dopant redistribution or diffusion. RTA for certain implant doses can increase junction depths to be significantly deeper than, for example, the as-implanted range.

For example, with regard to transistor devices, the consequences of a continued demand for small devices can be anticipated to include a limiting of lateral diffusion under the gate and a maintenance of high concentration of dopant material in a shallow source/drain extension region. Accordingly, the disclosed methods and systems include a combination of athermal annealing and rapid thermal annealing (RTA) to obtain a very shallow junction with a device having a low sheet resistance. The methods and systems accordingly utilize electromagnetic fields to induce current flow through a silicon wafer and cause ohmic collisions between high energy electrons and the silicon lattice structure to provide rapid heating of the silicon from within the structure, as opposed to RTA that applies high temperatures to the structure surface. The athermal heating of the silicon, referred to herein as Electromagnetic Induction Heating (EMIH), provides energy to activate the dopant that can provide greater activation than a method or system using RTA (also referred to and known as RTP). Low temperature RTA (LTRTA), understood herein to be temperatures less than approximately 800 degrees Celsius, but for the illustrated embodiments, preferably between approximately 500 degrees Celsius and approximately 800 degrees Celsius, can also be performed before and/or after the EMIH to further repair the silicon structure and minimize diffusion. LTRTA can be performed at a temperature, and for a time period, that can be significantly less than generally associated with processes that only use RTA annealing for dopant activation and crystallographic defect curing. Those of ordinary skill in the art recognize that merely using LTRTA can fail to activate the dopant and hence can result in a large sheet resistance. Accordingly, by combining the athermal annealing to provide dopant activation and the LTRTA (approximately 500–800 degrees Celsius) RTA to cure the structural defects, the dopant material can be activated, the lattice structure can be repaired, and differences between the as-implanted junction depth and the post-annealing junction depth can be minimized when compared to methods that use only RTA.

EMIH can be understood as a unique application of Faraday's and Ampere's laws. As a silicon wafer is exposed to oscillating magnetic fields, electrons are induced to flow within the wafer. As the electrons collide with the lattice, they release energy that heats the silicon wafer. This athermal, internal heating via EMIH can be compared to, for example, RTA that generally exposes the wafer to a furnace at a prescribed temperature and causes the silicon to be heated from the outside surface in, thereby raising a possibility of silicon melt.

Those with ordinary skill in the art recognize that for highly conducting materials such as copper, induced currents re-induce a magnetic field that partially or completely interferes with the incident electromagnetic field. Alternately, insulating materials such as quartz lack free carriers and hence preclude any flow of current, thereby allowing the incident field to penetrate the material. Semiconductors such as silicon can have properties of conductors and insulators, and thus can have a potential for significant electromagnetic field penetration that can induce substantial currents throughout the wafer volume.

In the disclosed methods and systems, electromagnetic fields can be induced by subjecting the silicon sample to electromagnetic energy having frequencies in the radio frequency (RF) and microwave ranges, although those with ordinary skill in the art will recognize that the methods and systems are not limited to these frequency ranges, and other methods of inducing electromagnetic energy can be used. The rapid, internal ohmic heating of the wafers caused by the induced currents in the silicon wafer can cause dopant activation that can be more effective than the activation that can be caused by the surface heating provided by RTA.

Referring now to FIG. 1, there is one embodiment of a microwave system that includes a resonant cavity having a radius of seventeen centimeters, and a height that can be adjusted between fifteen and forty-five centimeters for tuning to specific microwave modes. A magnetron source can provide a maximum three thousand watts of power at 2.45 GHz. One of ordinary skill in the art will recognize that various modes can be provided by a system according to FIG. 1, including but not limited to the well-known TM011 and TM111 modes. FIGS. 2A and 2B provide magnetic field patterns in the FIG. 1 microwave cavity for the TM011 and TM111 modes, respectively.

Figure 3:
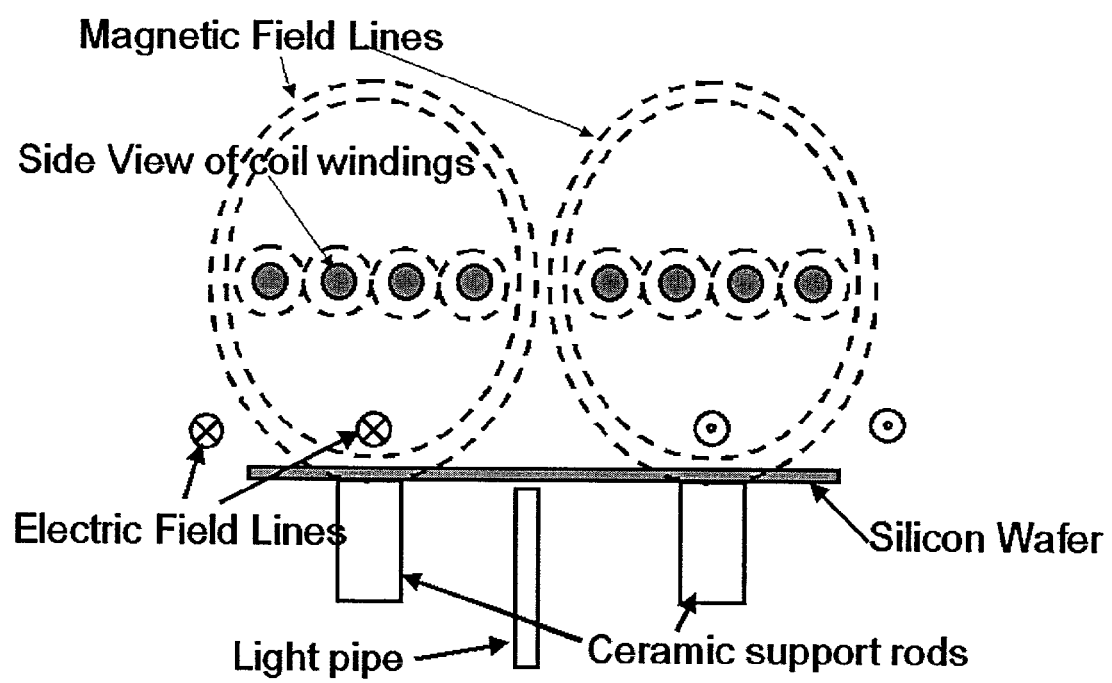
FIG. 3 is one embodiment of a radio frequency system and method for performing EMIH annealing.

Referring to FIG. 3, there is a RF embodiment of the disclosed methods and systems that utilizes an exciting RF magnetic flux with a spiral copper antenna. A power supply matched through an L-type matching network can provide up to one-thousand Watts at a fixed 13.56 MHz frequency. In the FIG. 3 system, a silicon wafer can be positioned on a ceramic chuck two-and-a-half centimeters below the coil windings in an extreme near field of the antenna. In the illustrated system, the ceramic chuck can be heated to one-hundred fifty degrees Celsius.

Those with ordinary skill in the art will recognize that the exemplary electromagnetic induction systems of FIGS. 1 and 3 are merely illustrative and the implementation thereof is not limited to the embodiments or characteristics provided herein. Furthermore, although FIGS. 2A and 2B provide two magnetic field patterns, such patterns are provided for illustration and not limitation. Accordingly, other systems that utilize alternate methods, frequencies, apparatus, magnetic field patterns, fewer or additional components or alternatives, etc., can be used without departing from the scope of the methods and systems disclosed herein.

For the illustrated systems of FIGS. 1 and 3, temperature measurements can be provided by collecting radiated light using an optical pyrometer or light pipe. The collected radiated light can be analyzed by, for example, a Luxtron model analyzer that matches the collected light intensities to a block body radiation spectrum to produce a temperature of the silicon wafer. In some embodiments, the spectrum may be modified or scaled to provide an accurate temperature measurement based on the emissivity of silicon.

Figure 4:
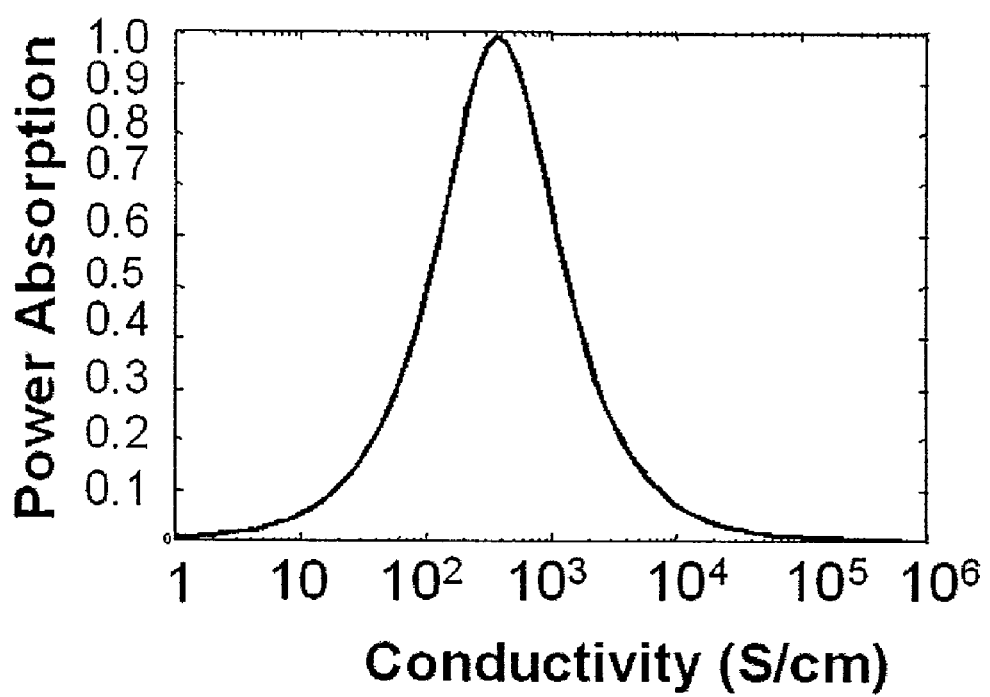
FIG. 4 displays a relationship between power absorption and conductivity.

The EMIH methods and systems can allow a prediction of a magnitude of the induced currents, and hence, the temperature. As provided previously herein, a solution of Faraday's and Ampere's laws can provide a description of the induced current density and the power absorbed, where:

$$P_{ABS} = \frac{\pi a^2 t_w^3 / (\delta^4 \sigma)}{1 + (t_w/\delta)^4} H_0^2, \delta = \sqrt{2/\omega\mu\sigma} \quad (1)$$

where $\delta$ is skin depth, $\omega$ is frequency, $\mu$ is permeability, $\sigma$ is conductivity, $t_w$ is thickness, "a" is radius, and $H_o$ is the incident magnetic field. FIG. 4 provides a plot of power absorption based on conductivity according to Equation 1. As FIG. 4 and Equation 1 indicate, the absorbed power increases with conductivity, $\sigma$, until a peak absorption is reached. Thereafter, the absorbed power decreases at the same rate of the increase and asymptotes to zero.

Figure 5:
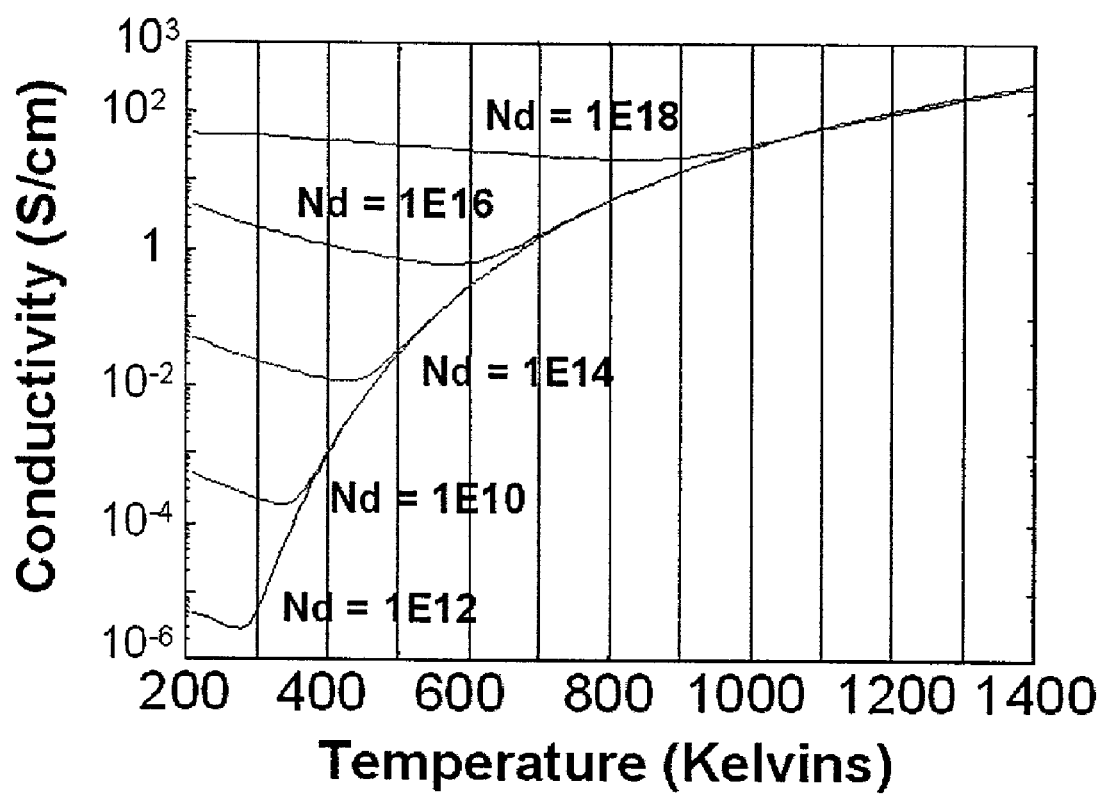
FIG. 5 displays a relationship between conductivity and temperature for various dopant levels.

The relationship between temperature and conductivity can be instrumental to understanding the FIG. 4 relationship between power absorption and conductivity. FIG. 5 provides the relationship between conductivity and temperature for a variety of substrate doping levels. It is well-known that although conductivity can be expressed as a product of mobility and carrier density, mobility decreases with temperature due to an increased collision frequency that impedes carrier flow, while carrier density increases with temperature as the increased thermal energy moves carriers from the valence band to the conduction band. Accordingly, as FIG. 5 indicates, conductivity can decrease until the temperature exceeds approximately one-hundred degrees Celsius, during which time collisions impede carrier mobility. As the temperature further increases, the increase in intrinsic carriers can exceed the loss in mobility to allow the conductivity to monotonically increase with temperature. The largest conductivity illustrated in FIG. 5 relates to the peak power absorption level in FIG. 4, and accordingly, when viewing FIGS. 4 and 5 together as a function of increasing temperature, it can be seen that for the smaller illustrated levels of doping, as temperature increases to approximately one-hundred degrees Celsius, conductivity (FIG. 5) decreases and hence power absorption (FIG. 4) is also decreasing, thereby preventing the wafer temperature from increasing. This can otherwise be known as an absorption valley. As the wafer temperature increases beyond this temperature (FIG. 5), however, conductivity increases with temperature, thereby also causing an increase in power absorption (FIG. 4) that can cause a rapid increase in temperature. At approximately five-hundred degrees Celsius, the intrinsic carrier concentration can greatly exceed the doping such that the conductivity, and hence heating, becomes independent of the substrate doping, and silicon wafers of varying dopant dosages can heat with identical characteristics.

Based on FIGS. 4 and 5, and the inference that higher frequency fields (e.g., microwave) can heat more efficiently than lower frequency fields (e.g., RF), in some embodiments, it can be necessary to pre-heat the silicon wafer to a temperature above the absorption valley. In some embodiments, for given power levels, the same wafer temperature can be achieved irrespective of whether one or more wafers are present. Accordingly, batch processing can be equally as effective.

Figure 6:
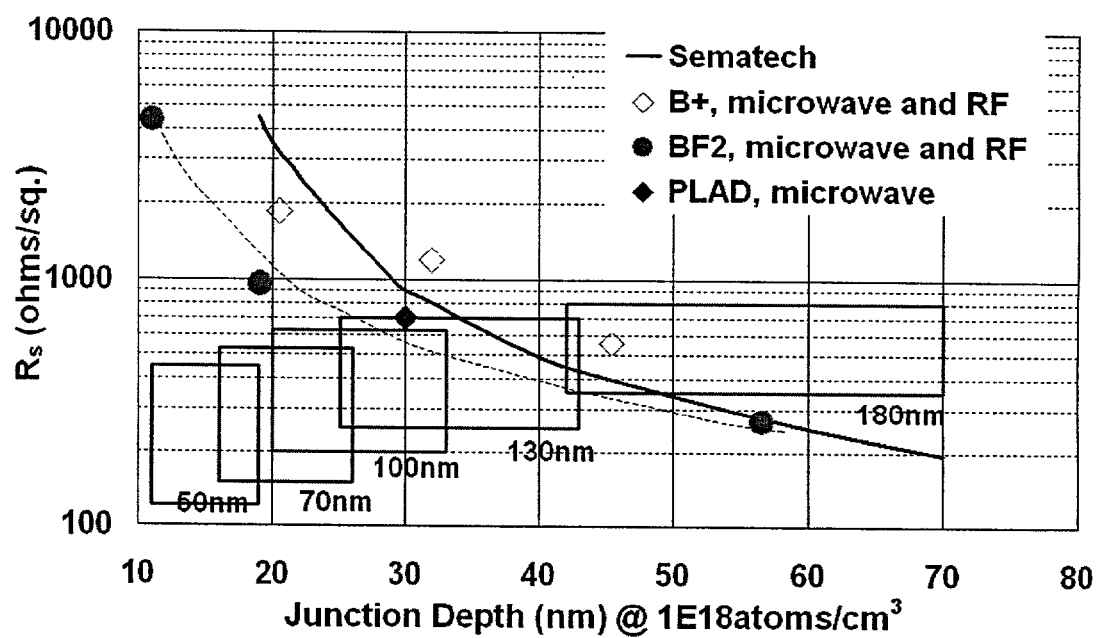
FIG. 6 includes a SEMATECH barrier curve for evaluating improvements in anneal and doping technology; and, FIG. 7 provides a SIMS profile for as-implanted and microwave spike annealed plasma doped (PLAD) samples.

In one embodiment of the methods and systems, $B^+$ and $BF_2^+$ ions, at a dose of $10^{15}/cm^3$, were implanted into n-type silicon wafers having resistivities between 10 and 20 ohm-cm over a range of implant energies between 250 eV and 2.2 keV. Another sample was implanted at a dose of $10^{15}/cm^2$ using plasma doping (PLAD) ($BF_3$ gas). The samples were annealed using EMIH, and specifically RF and microwave embodiments, to either 900 or 1000 degrees Celcius in an uncontrolled ambient at atmospheric pressure. FIG. 6 illustrates sheet resistances versus junction depth evaluated at $10^{18}/cm^3$ from SIMS. The solid line in FIG. 6 is the present SEMATECH barrier curve for evaluating improvements in anneal and doping technology. Those of ordinary skill in the art recognize that data points below the SEMATECH curve indicate a higher percentage of activated dopants and/or a more efficient annealed dopant profile than the SEMATECH standard.

Figure 7:
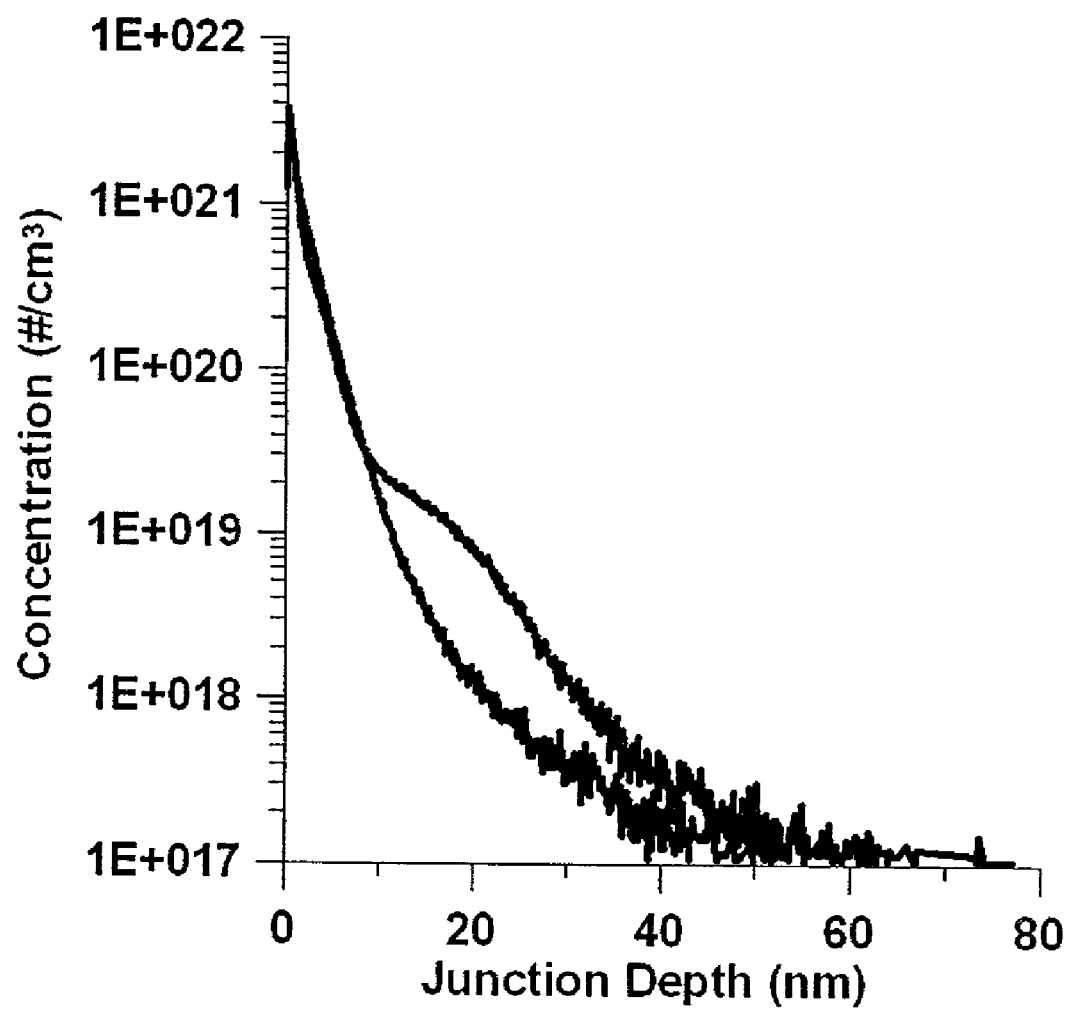

Referring now to FIG. 7, there are plots of SIMS results for the as-implanted and microwave spike annealed PLAD samples. Those with ordinary skill in the art also recognize that a more efficient profile can be obtained by a controlled ambient of oxygen (e.g. 33 to 100 ppm) to eliminate the oxygen-enhanced-diffusion effect.

In one embodiment of the methods and systems disclosed herein, sheet resistances were measured for implants of B+ at 250 eV and 500 eV, and BF2+ at 500 eV, 1.1 keV, 2.2 keV, and 4.5 keV, with implant doses of $1.0$ e15/cm$^2$, using EMIH annealing, and specifically, RF annealing at 13.96 MHz. In some embodiments, the RF anneal time was thirty seconds to 1000 degrees Celsius and 900 degrees Celsius, while a spike anneal was applied in other embodiments to the same temperatures. In all measured categories of ion beam energy, the thirty-second, 1000 degree temperature RF annealing provided the best sheet resistance, on the order of nearly 300 ohms/sq. to 850 ohms/sq. The remaining experiments described herein provided sheet resistances on the order of 500 ohms/sq to 7000 ohms/sq. Accordingly, although the RF annealing activates the dopant, defects remained in the lattice structure.

In another embodiment where microwave EMIH annealing was performed at 2.45 GHz, for thirty-second and spike annealing at 1000 and 900 degrees Celsius, sheet resistance measurements varied on the order of 150 ohms/sq. to 1000 ohms/sq. Once again, defects remained in the lattice structure.

By performing LTRTA (i.e., approximately 500–800 degrees Celsius) before or after EMIH annealing, defects in the lattice structure caused by the implantation can be cured without the undesirable diffusion effects caused by traditional RTA methods that necessarily provide silicon temperatures in a range between 900 degrees Celsius and 1200 degrees Celsius to activate the dopant. Accordingly, using the disclosed methods and systems that combine EMIH with low-temperature RTA, a junction and structure having high concentration dopant activation and lattice repair with low diffusion and sheet resistance, can be achieved.

What has thus been described is a method and system to achieve shallow junctions using Electromagnetic Induction Heating (EMIH) that can be preceded or followed by a low-temperature Rapid Thermal Annealing (RTA) process. The methods and systems can use, for example, RF or microwave frequencies, to induce electromagnetic fields that can induce currents to flow within the silicon wafer, thus causing ohmic collisions between electrons and the lattice structure that heat the wafer volumetrically rather than through the surface. Such EMIH heating can activate the dopant material. Defects in the silicon structure can be repaired by combining the EMIH annealing with a low-temperature (approximately 500–800 degrees Celsius) RTA that causes minimal diffusion, thus minimizing the difference between the as-implanted junction depth and the post-annealing junction depth when compared to annealing methods that only use traditional RTA.

The methods and systems described herein are not limited to a particular hardware or software configuration, and may find applicability in many computing or processing environments. The methods and systems can be implemented in hardware or software, or a combination of hardware and software. The methods and systems can be implemented in one or more computer programs executing on one or more programmable computers that include a processor, a storage medium readable by the processor (including volatile and non-volatile memory and/or storage elements), one or more input devices, and one or more output devices.

Although the methods and systems have been described relative to a specific embodiment thereof, they are not so limited. Obviously many modifications and variations may become apparent in light of the above teachings. For example, although the methods and systems illustrated herein referred to silicon semiconductors, other semiconductors, for example, from group IV of the periodic table, can be used, as well as other semiconductors. Furthermore, although the sample embodiments indicated Boron (B+) as a p-type dopant, the methods and systems can be applied to n-type dopants. Although LTRTA was illustrated as approximately 500–800 degrees Celsius, where the LTRTA can be performed using a furnace, LTRTA can be understood to include an exposure to temperatures less than approximately 800 degrees Celsius. The methods and systems disclosed include providing an oscillating magnetic field to induce the currents in the semiconductor, and although the illustrated methods and systems provided RF and microwave systems, any electromagnetic wave of any frequency that provides a time-varying or oscillating magnetic field can be used. For example, an EMIH embodiment can include a permanent magnet that can be moved to provide a time-varying magnetic field.

Many additional changes in the details, materials, and arrangement of parts, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

What is claimed is:

1. A method for annealing a semiconductor structure, the method comprising,
   after implanting a dopant into the semiconductor structure, subjecting the semiconductor structure to an oscillating magnetic electromagnetic field to induce current flow through the semiconductor structure so that ohmic collisions occur between high energy electrons and the lattice structure of the semiconductor wafer for rapidly heating from within the lattice structure of the semiconductor wafer, and,
   applying a low temperature rapid thermal annealing (LTRTA) process to the semiconductor structure to further repair the lattice structure and minimize diffusion of the dopant.

2. A method according to claim 1, wherein subjecting includes subjecting to a time-varying electromagnetic field.

3. A method according to claim 1, wherein subjecting includes providing a frequency in a microwave frequency band.

4. A method according to claim 1, wherein subjecting includes providing a frequency in a radio frequency (RF) band.

5. A method according to claim 1, wherein applying a LTRTA includes exposing the semiconductor to a temperature less than approximately 800 degrees Celsius.

6. A method according to claim 1, wherein applying a LTRTA includes exposing the semiconductor to a furnace having a temperature greater than approximately 500 degrees Celsius, and less than approximately 800 degrees Celsius.

7. A method according to claim 1, wherein applying a LTRTA can precede subjecting the semiconductor to an electromagnetic field.

8. A method according to claim 1, wherein applying a LTRTA includes using a furnace to perform the LTRTA.

9. A method for processing a semiconductor structure comprising:
   (a) subjecting the semiconductor structure to athermal heating to induce current flow through the semiconductor structure so that ohmic collisions occur between high energy electrons and the lattice structure of the semiconductor wafer for rapidly heating from within the lattice structure of the semiconductor wafer; and
   (b) applying a low-temperature rapid thermal anneal (LTRTA) process to the semiconductor structure.

10. A method according to claim 9, further comprising the step of implanting a dopant into the semiconductor structure by ion implantation before said step (a) and thereafter activating the dopant in said step (a) to implant the dopant into the semiconductor structure.

11. A method according to claim 9, further comprising the step of subjecting the semiconductor structure to an oscillating magnetic field to anneal the semiconductor structure.

* * * * *